United States Patent [19]

Hill

[11] Patent Number: 4,718,591
[45] Date of Patent: Jan. 12, 1988

[54] WIRE BONDER WITH OPEN CENTER OF MOTION

[75] Inventor: William H. Hill, Carlsbad, Calif.

[73] Assignee: Hughes Aircraft Company, Los Angeles, Calif.

[21] Appl. No.: 944,704

[22] Filed: Dec. 19, 1986

[51] Int. Cl.⁴ .................... B23K 1/06; B23K 20/10
[52] U.S. Cl. ................................ 228/1.1; 228/4.5; 228/45; 248/575
[58] Field of Search ............... 228/1.1, 4.5, 45, 104, 228/110; 269/91–94; 248/575; 219/85 F, 59.1, 60 A, 60 R

[56] References Cited

U.S. PATENT DOCUMENTS

| 3,737,614 | 6/1973 | Paulange | 219/60 A |
| 3,815,807 | 6/1974 | Bartley | 219/60 A |
| 4,379,215 | 4/1983 | Rohrberg | 219/60 A |
| 4,550,871 | 11/1985 | Chan et al. | 228/4.5 |
| 4,598,853 | 7/1986 | Hill | 228/4.5 |

FOREIGN PATENT DOCUMENTS 761203  9/1980  U.S.S.R. ...................... 228/4.5

Primary Examiner—Nicholas P. Godici
Assistant Examiner—Samuel M. Heinrich
Attorney, Agent, or Firm—Joseph E. Szabo; Anthony W. Karambelas

[57] ABSTRACT

A movable open center mounting for the tool of an ultrasonic wire bonding machine employs ball-bearing rollers (22, 24, 30, 32) to permit limited motion of the wire bonding tip (13a) substantially constrained to a vertical line with a minimum of tip skid. The mounting structure which is all positioned on one side of the tool tip includes a frame (10) of inverted U-shape having a pair of mutually spaced ball-bearing rollers (22, 24, 30, 32) on the end of each frame leg and a transducer support (12) positioned between the frame legs and having fixed roller contacting rods (90, 92, 96, 98) extending fore-and-aft between and partly under each of the respective rollers. A pair of springs (80, 82) urges the transducer support upwardly to press the fixed rods against the roller surfaces, allowing the transducer support to effectively rock about a center of motion (120) that is well below the bonder frame and transducer support, with the rocking motion being so constrained that the bonder tip moves substantially in a straight vertical line for small displacements.

13 Claims, 5 Drawing Figures

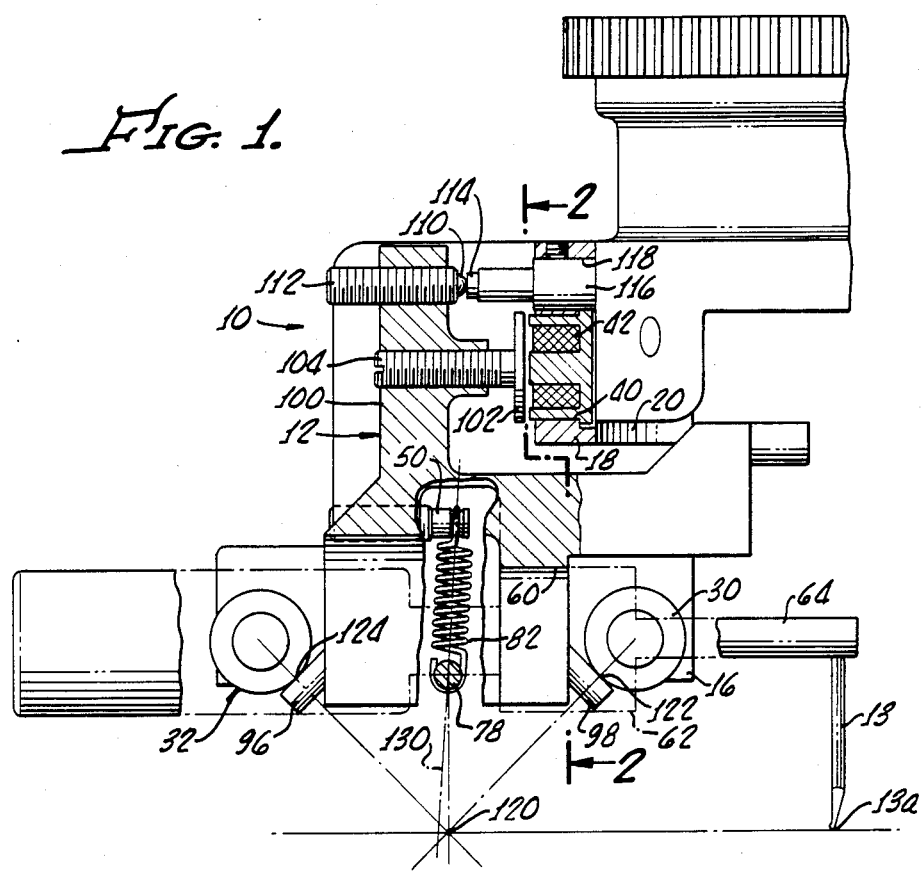
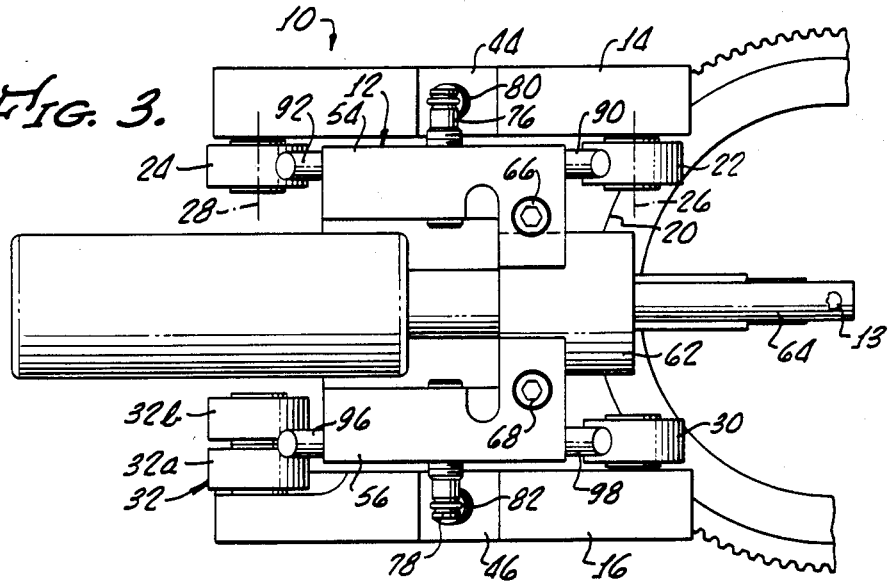

WIRE BONDER WITH OPEN CENTER OF MOTION

BACKGROUND OF THE INVENTION

1. Field of the Invention

The present invention relates to ultrasonic bonding machines and more particularly concerns an open center mounting that permits optimum substantially linear motion of a bonder tip.

2. Description of Related Art

In the manufacture of microelectronic circuit packages, certain electrical connections are made with extremely thin gold or aluminum wires. For example, connections between a semiconductor integrated circuit chip and package leads are typically made with such thin wires. As another example, active elements in semiconductor hybrid circuits may be interconnected with extremely thin wire.

Attachment of the interconnecting thin wires is commonly accomplished with an ultrasonic wire bonding machine which supplies wire and makes connections of the wire leads. Such a machine generally includes a wire bonding head which can move vertically, horizontally and rotatably about a vertical axis. An ultrasonic transducer, carrying a bonding tool, is pivotally mounted to the bonding head so that as the tool comes into contact with the workpiece it may be pivotally displaced through a very short distance about a horizontal axis, as may be required to ensure proper contact and pre-load. The transducer includes an arm to which the bonding tool is attached. Linear vertical movement of the bonding head raises or lowers the tool to a position in which the tool tip is close to but spaced from the workpiece. As the tool is finally lowered or initially raised to cause the bonding tip to contact or withdraw from the workpiece, the tool tip must be able to undergo a small vertical motion relative to the machine frame to accomplish or release the small tool preloading. This motion previously has been provided by pivotal motion of the transducer and its tool tip. However, such a pivotal motion introduces a small amount of horizontal motion, commonly termed "tip skid", in the course of the desired vertical preloading motion of the tip. Such horizontal component of motion causes a corresponding horizontal force component to be exerted on the wire which has been or is to be bonded, tending to improperly and undesirably displace the wire.

These undesired horizontal motion components are increased by the location of the tool tip pivot well above the workpiece, as is required to provide clearances required for the usual occupied center mounting. Therefore, if the pivot axis for the preloading motion of the tool tip is positioned above the plane of the workpiece, the adverse tip skid effect of the pivotal motion is increased.

My prior patent, U.S. Pat. No. 4,598,853, for Open Center Flexural Pivot Wire Bonding Head, describes a flexural pivot structure that employs a pair of leaf springs to provide a flexural mounting of the transducer and tool tip. This spring mount defines a vertical motion with minimized tip skid. The arrangement of my prior patent has been found to be efficient and effective, but greater rigidity and stability of the movable mounting for the ultrasonic transducer will provide improved efficiency, repeatability and reliability.

Accordingly, it is an object of the present invention to provide an open center mounting that provides some or all of the above-mentioned improvements.

SUMMARY OF THE INVENTION

In carrying out principles of the present invention, in accordance with a preferred embodiment thereof, an element support is mounted to a frame for motion about a center of motion that is displaced from the support and frame. The mounting arrangement includes mutually spaced guide members on the frame having first and second guide surfaces respectively positioned on one side of the center of motion and first and second guide followers on the element support having a moving contact with the first and second guide surfaces and positioned between the guide surfaces and the center of motion. Means are provided for urging the guide followers against the guide surfaces. The element support is effectively pivoted to the frame for motion about the displaced center, but, for small motions, a tool carried by the support moves with a linear motion that has only negligible transverse components.

In a specific embodiment the guide members are rollers journalled on the frame on transverse axes, and the guide followers are longitudinally extending rods fixed to the transducer carrying support and held against lower mutually facing surfaces of the rollers by tension springs. The springs are inclined to provide a desired preload.

BRIEF DESCRIPTION OF THE DRAWINGS

In the accompanying drawings:

FIG. 1 is a side view, partly in section, of portions of an ultrasonic bonding machine head embodying principles of the present invention;

FIG. 3 is a plan view of the bottom of the arrangement of FIG. 1;

DESCRIPTION OF THE PREFERRED EMBODIMENTS

Figure 4:
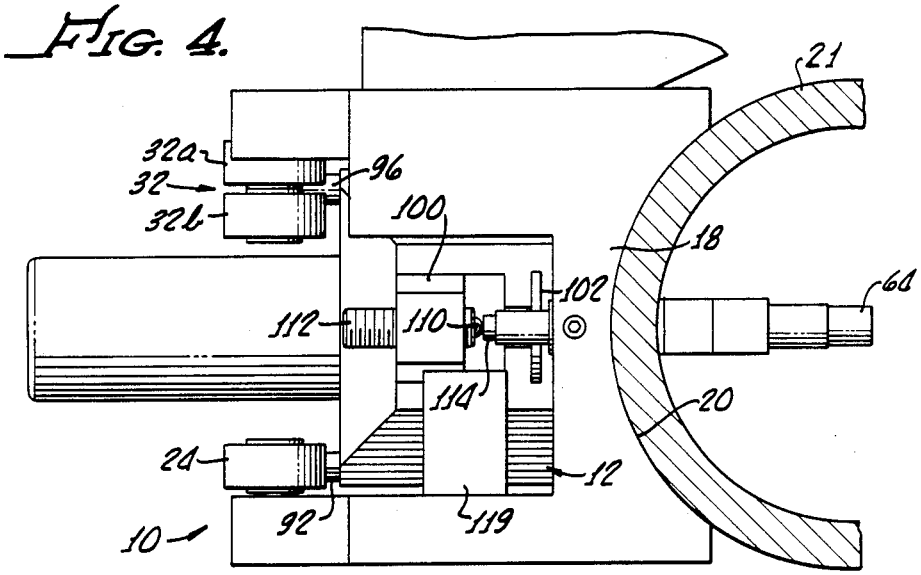
FIG. 4 is a plan view of parts of the top of the machine of FIG. 1.

An ultrasonic wire bonding machine embodying principles of the present invention incorporates a bonding frame 10 to which is movably mounted, by the open center mounting means of the present invention, a transducer support 12 which carries a bonding tool 13. The bonding frame is formed of a rigid body having a substantially inverted U-shape, including mutually spaced parallel side legs 14,16 and a bight or connecting portion 18. The bight 18 is formed with an arcuate forward facing surface 20 curved about a vertical axis and adapted to be bolted to a bonding head surface 21 (FIG. 4) which is connected to a bonder motion control apparatus (not shown), similar to that shown in my prior U.S. Pat. No. 4,598,853. The motion control apparatus enables the entire bonder head, including frame 10 and transducer support 12, to be moved vertically, horizontally and rotatably about the vertical axis of arcuate surface 20.

Rotatably mounted to inner surfaces of the side leg 14 are first and second ball-bearing rollers 22,24 journaled to the side leg about mutually spaced fixed transverse axes 26,28 (FIG. 3) which extend substantially horizontally and normal to the longitudinal or fore-and-aft axis of frame 10. Similarly, a second pair of ball-bearing rollers 30,32 are journaled to the side leg 16 at the inner side thereof on the same axes 26 and 28 respectively. Roller 32 is a double roller having mutually aligned rollers 32a, and 32b that are slightly spaced axially from one another.

Secured in a hole 40 that is formed in the arcuate surface 20 and extends through bight 18, is an electromagnet 42 (FIG. 1).

Each side leg 14,16 is formed with a vertically extending, downwardly opening recess 44,46 at the upper end of which are fixedly mounted spring holding frame screws 48,50 which are cantilevered to project longitudinally of the frame into the respective recesses but not completely across the recesses.

Figure 2:
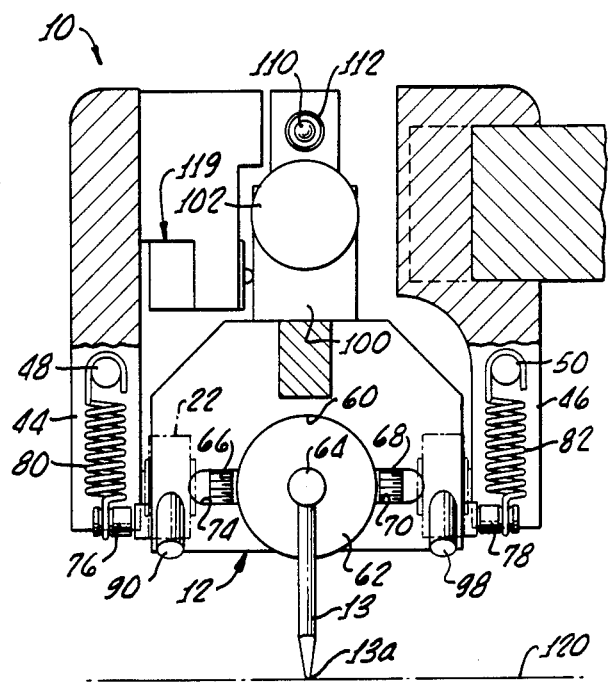
FIG. 2 is a cross section taken on lines 2—2 of FIG. 1 of the arrangement of FIG. 1, with parts broken away and parts shown in elevation.
Figure 5:
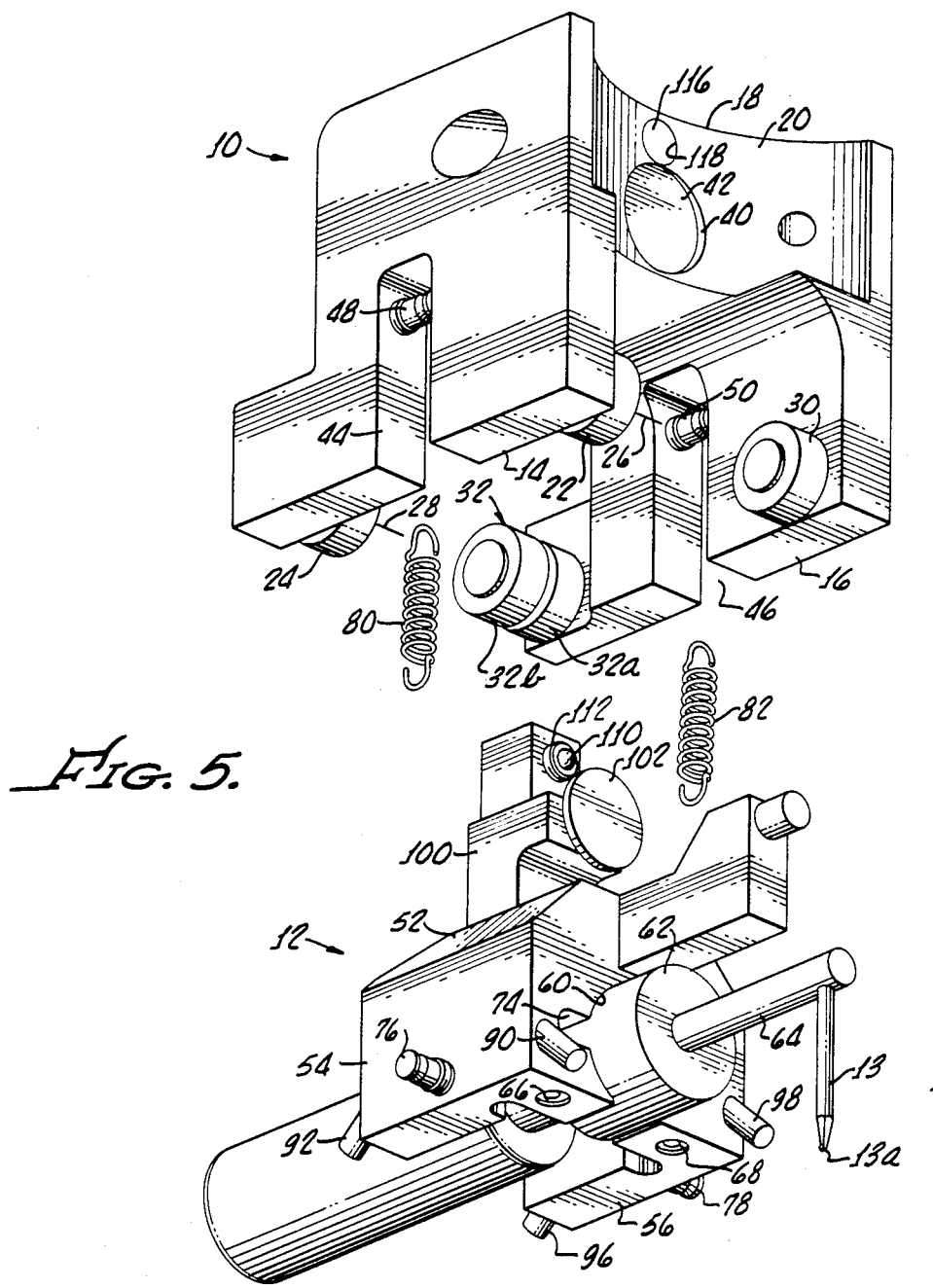
FIG. 5 is an exploded perspective view of the bonder frame and transducer support of the arrangement of FIGS. 1 through 4.

The transducer support, as pictorially illustrated in FIG. 5, comprises a rigid yoke 52 having side legs 54 and 56 laterally spaced apart to provide a downwardly opening and longitudinally extending arcuate bore 60 (FIG. 2) which receives the cylindrical body 62 of an ultrasonic transducer having a forwardly extending longitudinal arm 64 to which is secured the bonder tip 13, projecting downwardly from the arm 64. Transducer 62 is secured in the arcuate bore 60 of the yoke by means of a pair of screws 66,68 which are employed to forcibly close a pair of inwardly opening slits 70,74 (FIG. 2) formed in the inner surfaces of the bore 60 to thereby clamp the transducer to the yoke.

Extending transversely outwardly from substantially central portions of the lower ends of the yoke legs 54,56, are cantilevered spring holding yoke screws 76,78 having tension springs 80,82 secured at their lower ends to the screws 76,78 and at their upper ends to the frame screws 48,50.

First and second longitudinally extending rigid circular cylindrical follower rods 90,92 are fixedly secured, as by being a press fit for example, in front and back ends of yoke side leg 54 and extend downwardly and outwardly from the yoke leg into contact with surfaces of rollers 22,24 that are below and inwardly of the roller axes. Similarly, a pair of longitudinally extending rigid circular cylindrical follower rods 96,98 are fixed to the forward and rearward ends of yoke leg 56 extending downwardly from the yoke leg and contacting portions of the outer surface of rollers 30,32 that are below and inwardly of the roller axes. As previously mentioned, roller 32 is a double coaxial roller, comprising coaxial roller sections 32a and 32b, which are slightly spaced apart axially to receive the rigid follower pin 96 therebetween. This pin contacts the spaced adjacent edges of the two rollers, thereby providing for relatively fixed lateral positioning of the frame with respect to the yoke.

The upper intermediate section of yoke 52 carries an upstanding post 100 to which is mounted a disc 102 of magnetic material having a face positioned closely adjacent to but slightly spaced from the face of the electromagnet 42 on the frame. Longitudinal position of the disc 102, relative to the magnet 42, is adjustable by means of a screw 104, integral with disc 102 and threaded in post 100 and connected to the disc 102.

An electrical contact 110 carried on an arm 112 that is adjustably threaded in the yoke post 100, cooperates with a second contact 114 carried in a sleeve 116 fixed in a hole 118 of the bight 18 to provide both a physical stop for limiting motion of the upper portion of the yoke toward the frame (toward the right, as viewed in FIG. 1) and an electrical sensor to signal touchdown of the tip 13a on the workpiece by responding to the counterclockwise (as viewed in FIG. 1) motion of the yoke that occurs upon touchdown, which motion separates the normally contacting electrical contact elements 110 and 114.

An optical sensor assembly 119 (FIGS. 2 and 4) carries a light emitting diode (not shown) and a photo detector (not shown) for detecting the forward edge of post 100. The optical center of the sensor assembly is aligned with the forward edge of post 100 so that the sensor provides an output signal that increases as the post 100 moves to its forward limit position.

The apparatus is nominally set up so that a virtual center of motion 120 (FIG. 1) lies in a plane parallel to a line containing the axes 26,28 of the rollers 22,24 and containing the tip 13a of tool 13. The virtual center 120 is equidistant from the axes 26,28 and lies on a vertical line containing the center of gravity of the yoke. The longitudinal axes of follower rods 90,92 are perpendicular to the respective radii of the rollers at the points of tangential contact 122,124 between the follower rods and the respective roller surfaces. The roller radii through the tangential contact points meet at the center of motion 120. The rollers and rod followers are symmetrically disposed on either side of a plane extending parallel to the roller axes and bisecting and perpendicular to the line between the axes. Assuming the axes of springs 80,82 are vertical, as viewed in FIG. 1, (they are actually tilted for preloading as described below) and equidistant from the roller axes 26,28, the yoke will be urged upwardly by the springs so that the points of contact between the follower rods and the rollers are equidistant between the intersections of the roller surfaces with a line joining the axes 26,28 and the intersection of the roller surface with a vertical line extending downwardly from the roller axes. In other words, the tangent points are half way between intersections of horizontal and vertical diameters of the rollers. The structure attains a position of static equilibrium in which the forces on the yoke, exerted by the nominally vertically directed spring axes, are balanced by vertically downward components of force exerted by the rollers on their respective follower pins at the respective tangent points. The rollers, being substantially frictionless, can exert on the follower rods only forces directed radially of the rollers at the tangent points. Horizontal components of these forces are equal and opposite, and thus the springs hold the rollers in a position of fore-and-aft equilibrium from which the yoke may be displaced about the virtual center 120 by a motion that effectively moves each follower rod along the surface of the roller. Stated otherwise, such motion effectively causes the rods to roll along the roller surfaces. Thus, for example, if the yoke is moved about the center of motion so that the upper portion of the yoke moves toward the right, as illustrated in FIG. 1, the forward rod 98 moves along the surface of roller 30 downwardly and toward the right while the rear rod 96 moves along the surface of its rollers 32a and 32b upwardly and toward the right. The net effect of this motion about the virtual center 120 is a substantially linear vertical motion of the tip 13a of the tool 13. There is effectively no horizontal motion of the tool tip within reasonably small ranges of relative motion of the yoke and frame. Thus any tip skid is negligible.

Screws 48,50 are adjustably threaded in the frame sides 14,16 so as to enable adjustable variation of the point to which the upper ends of each of the springs is attached. This provides a downward bias of the tool tip for tool force preload. The upper end of each spring may be moved forwardly or rearwardly by adjustment of the screws 48,50 to thereby achieve a vertical inclination of the spring axes. Thus, as illustrated in FIG. 1, the screws 48,50 are positioned within the frame so that the upper portions of springs 80 and 82 are positioned sufficiently to the right of a vertical line through the virtual center 120 that the spring axes lie along lines indicated at 130. With this inclination of the spring axes, the yoke has a nominal position of equilibrium in which the tool tip 13a is displaced linearly downwardly below the position which it would assume if the spring axes were vertical. However, motion toward this nominal equilibrium position, in which the tool tip 13a is below the position illustrated in FIG. 1, is restrained by abutment of the contact elements 110,114 which serve to limit the clockwise position to that shown in FIG. 1. Thus, the inclination of the spring axes provides a downward bias force, preferably in the order of about 10 grams, which the tool tip will exert upon the workpiece before the contact elements separate.

In operation of the described bonder, during head motion the yoke is locked to the frame by energization of electromagnet 42 to strongly draw the disc 102 toward the fixed frame structure of the magnet. The entire bonder head is moved to a desired position above its bonding location and then moved downwardly, relatively rapidly. When the tool tip 13a is a predetermined distance above the workpiece, downward motion is slowed and the electromagnetic lock is released. Release of the force of the magnet removes the magnetic locking force but does not result in any motion of the yoke which is still biased by the inclined springs to maintain abutment of the contact elements 110,114. Further and slower downward vertical motion of the entire head brings the tip 13a into contact with the workpiece. After initial contact between the tip 13a and the workpiece, continued downward motion increases the reaction force exerted upon the tool tip by the workpiece until it reaches the approximately 10 gram preload caused by the inclination of the spring axes. When the reaction force on the tool tip exceeds the spring load, the upper portion of the yoke moves toward the left (as the tool tip moves vertically upwardly with a linear motion), elements 110,114 separate and a signal is provided to either stop the further downward motion or to enable a predetermined additional amount of downward motion so as to provide some additional increment of preloading.

Although in a presently preferred embodiment the rollers are mounted on the frame and the follower pins are fixed to the movable yoke, it will be readily appreciated that these parts may be reversed with the rollers journaled on the movable yoke and the follower pins fixed to the frame. However for a vibratory device such as the illustrated transducer support it is preferred to place the movable parts, such as the rollers, on the fixed frame.

There has been described an unique mounting for providing limited but substantially entirely linear relative displacement of parts in which frictionless rollers and rod followers are employed to afford a more stable and solid mounting of a movable vibratory part.

What is claimed is:

1. Mounting apparatus for relatively movable parts comprising:
   a first part,
   a second part having an element to be moved relative to said first part, and
   mounting means for mounting the second part to the first part for motion of said element about a center of motion displaced from said first and second parts, said mounting means comprising
      first and second mutually spaced rolling guide members rotatably mounted on said first part on first and second mutually spaced axes, said guide members having first and second arcuate guide surfaces, respectively, positioned on one side of said center of motion,
      first and second guide follower rods on said second part in rolling contract with said first and second guide surfaces respectively and positioned between said guide surfaces
   and said center of motion, and
      means for urging said guide follower rod against said guide surfaces and away from said center of motion.

2. The apparatus of claim 1 wherein said guide members comprise first and second rollers.

3. The apparatus of claim 1 wherien said guide members comprise first and second rollers rotatably mounted to said first part on first and second mutually spaced axes, and wherein said guide followers comprise first and second rods in rolling contact with said first and second rollers respectively.

4. The apparatus of claim 1 wherein said guide follower rods contact said guide members at points between the respective guide member axes and said center of motion.

5. The apparatus of claim 1 wherein said guide members comprise first and second rollers rotatably mounted to said first part on first and second mutually spaced axes positioned on a line at said one side of said center of motion, said first and second guide followers comprising first and second rods fixed to said second part and respectively contacting said first and second rollers at points on the surfaces thereof between said center of motion and the respective roller axes, said means for urging comprising spring means interconnected between said first and second parts for urging said second part relative to said first part in a direction away from said center of motion.

6. The apparatus of claim 1 wherein said guide members are disposed on either side of a plane containing said center of motion and extending normal to a line between said guide members, and wherein said means for urging comprises means for exerting a force on said first part directed at an angle to said plane.

7. An ultrasonic wire bonder comprising:
   a bonder frame,
   a transducer support having a bonder tip connected thereto,
   mounting means for mounting the transducer support to the bonder frame for motion of said bonder tip about a center of motion displaced from said transducer support and frame, said mounting means comprising:
      first and second mutually spaced rotatably mounted rolling guide members on said frame having first and second arcuate guide surfaces, respectively, positioned on one side of said center of motion, first and second guide followers on said transducer support in moving contact with said first and second guide surfaces respectively and positioned between said guide surfaces and said center of motion, and means for urging said guide followers against said guide surfaces, said urging means including spring means connected between said frame and said transducer support for urging said transducer support away from said center of motion.

8. The ultrasonic bonder of claim 7 wherein said guide members comprise first and second rollers rotatably mounted to said frame at first and second mutually spaced roller axes positioned on a line at said one side of said center of motion, said first and second guide followers comprising first and second rods fixed to said transducer support and respectively contacting said first and second rollers at points on the surfaces thereof between said center of motion and the respective roller axes.

9. The ultrasonic bonder of claim 7 wherein said guide members are disposed on opposite sides of a plane containing said center of motion and extending normal to a line between said roller axes, said spring means comprising a spring having an axis extending at angle to said plane, whereby said bonder tip is urged in a first direction relative to said center of motion, and including stop means for limiting motion of said bonder tip in said first direction, whereby said bonder tip is resiliently preloaded in said first direction.

10. An ultrasonic wire bonder comprising:
a bonder frame having first and second fixedly interconnected side legs transversely spaced from one another,
first and second longitudinally spaced rollers rotatably mounted on said first side leg,
third and fourth longitudinally spaced rollers rotatably mounted on said second side leg,
a transducer support extending from one of said side legs to the other and adapted to carry a bonding transducer,
said bonder frame and transducer support being displaced from and on one side of a virtual center,
first and second longitudinal follower members fixed to said transducer support at one side thereof, said follower members respectively extending forwardly and rearwardly from said transducer support and respectively contacting said first and second rollers between said rollers and said virtual center,
third and fourth longitudinal follower members fixedly connected to the other side of said transducer support, and third and fourth follower members respectively extending forwardly and rearwardly from said transducer support and respectively contacting said third and fourth rollers between said rollers and said virtual center, and
means for urging said follower members to their respective contacts with said rollers.

11. The bonder of claim 10 wherein each of said side legs has an end and wherein said first and second rollers are positioned adjacent the end of said first side leg, each said first and second roller having an arcuate contact surface extending around the periphery of said roller between a first line that joins the centers of said first and second rollers and a second line that extends from the roller center to the end of the side leg on which the roller is mounted, said follower members being positioned to contact said rollers on the contact surfaces thereof respectively, said means for urging comprising means for urging said follower members in a direction transverse to said line joining said roller axes and away from said virtual center.

12. The bonder of claim 11 wherein each said side leg of the bonder frame has a recess extending from the end thereof inwardly of the leg, and wherein said means for urging comprises spring mounting support pins fixed to said transducer support on opposite sides thereof and respectively exteding into the recesses of said first and second side legs at lower portions thereof, first and second spring mounting frame pins fixed to said frame and extending into said recesses at upper portions thereof, said means for urging also comprising first and second tension springs extending in said first and second recesses between said support pins and said frame pins.

13. The bonder of claim 12 wherein said rollers and rod followers are symmetrically disposed on either side of a plane extending parallel to said roller axes and bisecting a line drawn between the axes of said first and second rollers, said tension springs being inclined to said plane to bias said transducer support relative to said frame.

* * * * *